United States Patent [19]

Burt et al.

[11] Patent Number: 4,636,916
[45] Date of Patent: Jan. 13, 1987

[54] APPARATUS FOR MINIMIZING OPTICALLY AND THERMALLY INDUCED NOISE IN PRECISION ELECTRONIC COMPONENTS

[75] Inventors: Rodney T. Burt; Robert M. Stitt, both of Tucson, Ariz.

[73] Assignee: Burr-Brown Corporation, Tucson, Ariz.

[21] Appl. No.: 738,530

[22] Filed: May 24, 1985

Related U.S. Application Data

[63] Continuation of Ser. No. 597,027, Apr. 5, 1984, abandoned.

[51] Int. Cl.[4] .............................................. H05K 7/20
[52] U.S. Cl. .................................... 361/386; 361/405; 361/424
[58] Field of Search ............ 174/16 HS, 35 R, 35 TS; 165/185; 357/81; 361/386-389, 383, 424, 400, 403, 405; 29/832, 834, 837

[56] References Cited

U.S. PATENT DOCUMENTS 2,745,895  5/1956  Lideen ............................ 174/16 HS
3,546,362 12/1970  Berger ................................. 361/405
3,551,873 12/1970  Weyenberg ........................ 361/405

OTHER PUBLICATIONS

Low Power Heat Sinks, Aham Publication, Series 200 Press on Coolers, 1974, pp. 1-8, Woburn, Mass.

Primary Examiner—G. P. Tolin
Attorney, Agent, or Firm—Harry M. Weiss & Associates

[57] ABSTRACT

Method and apparatus for minimizing unpredictable sources of noise, or error voltages, at the microvolt level in precision analog components such as operational amplifiers is described. Sources of such error voltages are temperature gradients across the dice of the precision components enclosed in a hermetically sealed package, thermoelectric voltages caused by temperature differences between junctions of leads of the package with other metals, and light reflected from the substrate through the glass seals around the leads in the base of such packages. A skirted heat sink is positioned in thermal contact with the sides of the package which package is mounted on a substrate. The heat sink transfers heat from the heat sink to its ambient environment by radiation and convection to maintain the temperature within the package substantially constant. The skirt depending from the heat sink encloses the space between the base of the package and the surface of the substrate to form a substantially isothermal enclosure to maintain the temperature of the leads of the package substantially constant. The depending skirt also blocks, or absorbs, radiation from the ambient environment of the package which prevents such radiation from being transmitted through the seals of the package to minimize the production of photoelectric induced error voltages induced in photosensitive circuits of the component.

6 Claims, 4 Drawing Figures

APPARATUS FOR MINIMIZING OPTICALLY AND THERMALLY INDUCED NOISE IN PRECISION ELECTRONIC COMPONENTS

This application is a continuation, of application Ser. No. 597,027, filed Apr. 5, 1984, now abandoned.

BACKGROUND OF THE INVENTION

(1) Field of the Invention

This invention is in the field of methods and apparatus for minimizing unpredictable sources of error voltages in packaged precision analog components.

(2) Description of the Prior Art

Designers of systems that require precision analog components are always seeking such components that are more accurate, i.e., components in which the error voltages, or noise, are minimized to the maximum extent possible without degrading the reliability or increasing the costs of such components. Examples of such precision analog components are bipolar and FET input operational amplifiers, instrument amplifiers, voltage references, preamplifiers, discrete components, and multifunction circuits.

The sources of noise, or error voltages, in such components can be divided into two categories, the predictable sources of error voltages and the so-called unpredictable sources. Predictable sources of error voltages can be compensated by improved design, precise trimming, and improved manufacturing techniques which include enclosing such components in hermetic packages.

The prior art has identified two of the unpredictable sources of noise as being caused by temperature gradients in the dice, or I.C. chips, of the component and by temperature differences between the junctions of the leads of a packaged component, one junction being internal, or within the package and the other junction being external, made with conductors on substrates, or printed circuit (P.C.) boards on which the package containing the component is mounted. One prior art solution to minimizing error voltages from the above-identified sources is to enclose the entire system of which the precision component or components are a part in a suitable enclosure which maintains all of the elements at a substantially constant temperature. A prior art solution to the thermal gradient problem is to provide the components with an on chip stabilizer circuit which maintains the temperature of the chips, or dice, substantially constant. However, in many applications the prior art solutions to the problem of minimizing error voltages in precision analog components is either not possible or is not economically feasible. The problem not solved by the prior art is how to minimize the so-called unpredicable sources of error in individually packaged precision analog components without requiring the entire system of which the component is a part to be provided with or packaged in an ideal environment; or, stated another way, to provide each packaged precision analog component with its own idealized environment.

SUMMARY OF THE INVENTION

As stated in the Description of the Prior Art, the prior art has identified two sources of unpredicable error voltages, or noise, in precision analog electronic components such as operational amplifiers. One such source being caused by temperature gradients in the dice, or chips, of the component. This source of noise can be minimized by maintaining the temperature throughout the dice, or chips, of the components substantially constant. Another source is thermoelectric voltages produced by the contact of dissimilar metals at the internal and external junctions of the leads of the package when mounted on a substrate if the junctions are at different temperature, the so-called thermocouple effect. Maintaining the junction of each lead of the package at substantially the same temperature will minimize this source of error voltages, or noise.

Applicants have also discovered a third source of unpredictable error voltages. The leads in the type of package utilized commonly to enclose such components are insulated from one another and the container by glass insulation. Applicants have discovered that light reflected primarily from the surface of the substrate on which the package is mounted can be transmitted into the interior of the package through this glass insulation of the base which light will produce photoelectric voltages in photosensitive circuits of the component, another source of noise, or error voltages.

To minimize the causes of unpredictable error voltages, or noise, in individually packaged precision analog components, a heat sink having a substantial thermal mass is placed around the periphery of the package in good thermal contact with the outer surface of the package of the precision analog component after the component is mounted on a substrate. The heat sink is made of a material having a high specific heat and good thermal conductivity. Its outer surface is provided with fins, or projections, and also is provided with a surface finish characterized as being highly emissive so that heat from the heat sink is transferred by radiation and convection to the ambient environment. The heat sink essentially maintains the temperature of the interior of the package with which it is in contact at a substantially constant temperature after an initial warm up period.

To provide an isothermal enclosure for the space between the base of the package containing the component and the surface of the substrate on which the packaged component is mounted, the heat sink is provided with a depending integral skirt which when the heat sink is properly placed on the package substantially contacts the surface of the substrate to form an isothermal chamber. The skirt which is also provided with a highly emissive surface blocks or absorbs incident radiant energy that otherwise could be transmitted through the glass seals around the leads in the base of the package into the interior of the package to produce error voltages by the photoelectric effect. The isothermal enclosure formed by the skirt of the heat sink maintains the interior and exterior junctions of the leads in the package at a substantially constant temperature; thus minimizing any thermoelectric induced error voltages from being produced by these junctions.

It is therefore an object of this invention to provide method and apparatus to minimize error voltages from unpredictable sources, package noise, in packaged precision electronic components.

It is another object of this invention to provide method and apparatus for providing each individually packaged precision component with an ideal environment to minimize environmentally caused error voltages, or package noise, in such components.

It is yet another object of this invention to provide method and apparatus which minimizes light induced errors in precision electronic analog components packaged in hermetic packages.

It is still another object of this invention to provide individually packaged precision analog components mounted on the substrate with a skirted heat sink which maintains the temperature within the package substantially constant, provides a substantially isothermal enclosure between the base of the package and the substrate, and which substantially prevents incident radiant energy from being transmitted through the glass insulating seals around leads of the package into the interior to produce photoelectric induced noise.

DESCRIPTION OF THE DRAWINGS

Other objects, features and advantages of the invention will be readily apparent from the following description of the preferred embodiment thereof, taken in conjunction with the accompanying drawings, although variations and modifications may be effective without departing from the spirit and scope of the novel concepts of the disclosure, and in which.

DESCRIPTION OF THE PREFERRED EMBODIMENT

Figure 1:
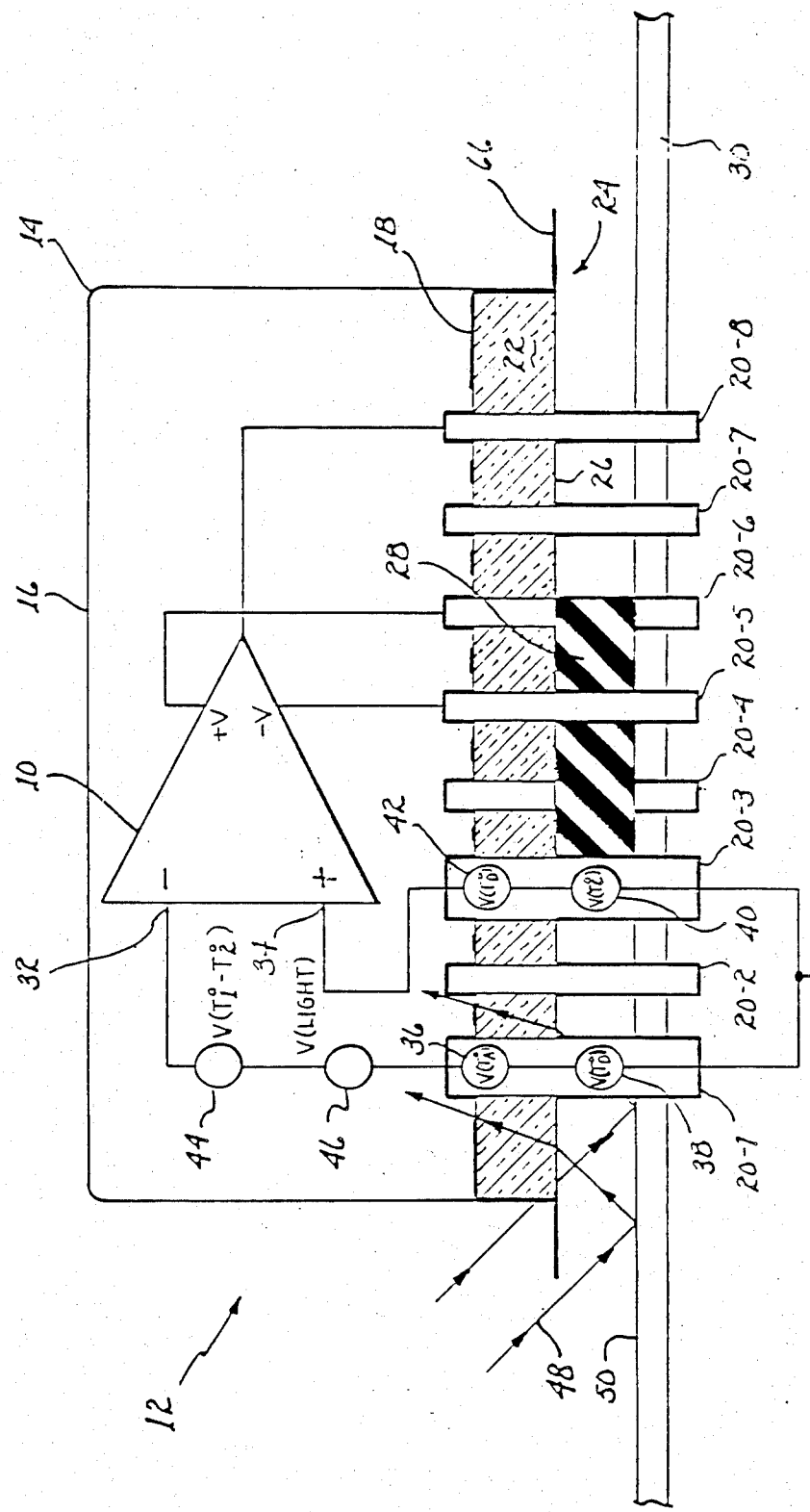
FIG. 1 is a schematic block diagram of a packaged precision analog component identifying sources of unpredictable error voltages.

In FIG. 1, a precision analog operational amplifier 10 is schematically illustrated as being located in hermetic package 12. In the preferred embodiment package 12 is identified as being a TO-99. Package 12 includes a cylindrical metal can 14 having an integral top surface 16. Metal eyelet 18 is secured in the lower open end of can 14. The leads 20-1 thru 8 extend through openings in eyelet 18 and are held in place and insulated from one another and package 12 by glass seal 22. Eyelet 18 and seal 22 form base 24 of package 12. Projecting from the bottom surface 26 of base 24 is insulating spacer 28. Package component 10 is adapted to be mounted on a substrate, or P.C. board, 30 with the leads 20-1 through 8 being bonded at one end to conductive runs on substrate 30 and at the other end to conductors within package 12.

In the preferred embodiment leads 20-1 through 8 are made of Kovar with a gold layer forming the internal junctions of leads 20 within package 12 and the external junctions of leads 20 which are outside of package 12. In FIG. 1, the width of leads 20-1 connected to the inverting input 32 of op. amp. 10 and of lead 20-3 connected to the noninverting input 34 are illustrated as being thicker than the other leads 20 for the purpose of illustration only. The internal and external junctions of leads 20-1 through 20-8 produce thermoelectric voltages at these junctions between the Kovar leads and the gold, copper or solder layers at the ends thereof which junctions under certain circumstances can produce relatively significantly large error voltages. The most significant generators, or sources, of theremoelectric voltages affecting the operation of op. amp 10 are denoted symbolically in FIG. 1. Thus, thermoelectric source of voltage 36 ($VT_A^o$) is the thermoelectric voltages produced by the internal junction of lead 20-1 and the metal to which it is bonded. Generator 38 ($VT_B^o$) denotes the source of voltage produced by the external junction of lead 20-1; generator 40 ($VT_C^o$) denotes the source of the voltage produced by the external junction of lead 20-3; and generator 42 ($VT_D^o$) denotes the source of the thermoelectric voltage which is produced by the internal junction of lead 20-3.

The other sources of error voltages, or noise, constituting or being defined as packaged noise, are generators 44 $V(T_1^o-T_2^o)$ and generator 46 V(LIGHT). Generator 44 symbolically represents a source of error voltages resulting from the temperature gradients ($T_1^o-T_2^o$) existing across the dice, or I.C. chips, of op. amp 10. Generator 46 represents the sources of error voltages produced as the result of incident radiant energy 48 from external, or ambient, light sources reflected from the upper surfaces 50 of substrate 30 through seal 22 which light, when absorbed by light sensitive circuits of op. amp 10, produces photoelectric voltages V(LIGHT). Since the thermal gradient error voltage poroduced by generator 44 is a function of the temperature differences across the dice of op. amp 10, this voltage can be reduced or minimized by reducing the temperature gradient across the dice. The magnitude of the photoelectric error voltages produced by photoelectric source 46 can be minimized by preventing light from entering into the interior of package 12. Maintaining the internal and external junctions of leads 20 at substantially the same temperature will cause the output of generators 36, 38, 40 and 42 to have the same values so that the thermoelectric voltages produced at the inner and outer junctions of leads 20-1 and 20-3 will cancel to produce a substantially zero error voltage from these sources.

Figure 2:
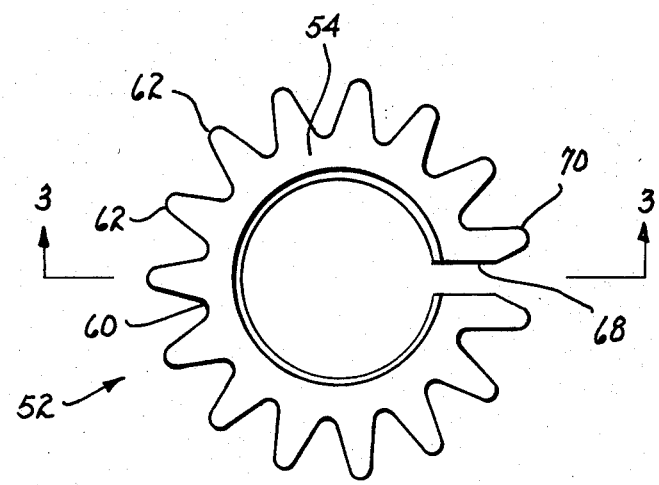
FIG. 2 is a plan view of the skirted heat sink of the invention.
Figure 3:
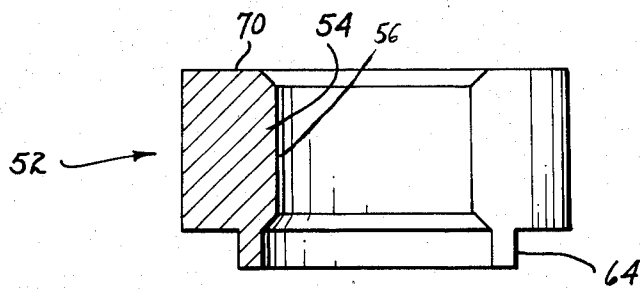
FIG. 3 is a section taken on line 3—3 of FIG. 2.
Figure 4:
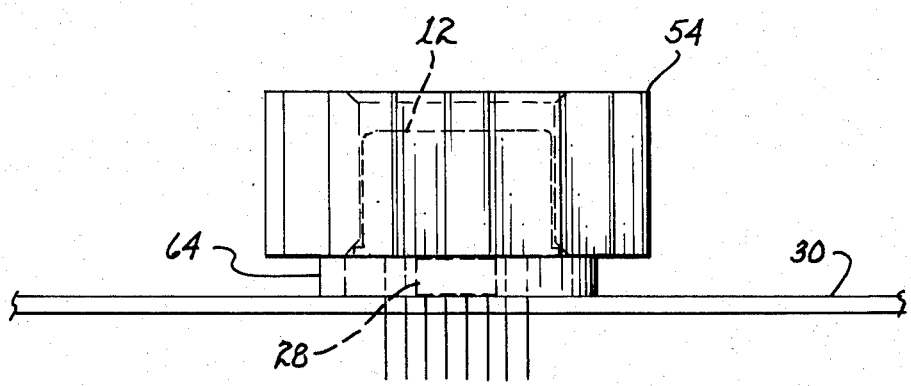
FIG. 4 is a side elevation of the heat sink of FIG. 3 positioned on a packaged component mounted on a substrate.

In FIGS. 2 and 3, skirted heat sink 52 includes a cylindrical ring 54 the diameter of the inner surface 56 of which is made slightly smaller than that of the outer cylindrical surface 58 of package 12. The outer surface 60 of ring 54 is provided with a plurality of substantially equiangularly spaced radial projections, or fins, 62. Depending from ring 54 is an integral cylindrical skirt 64. The inner diameter of skirt 64 is made slightly larger than the diameter of rim 66 of eyelet 18. To facilitate placing heat sink 52 on package 12 a slit 68 may be made in ring 54 and skirt 64.

Heat sink 52 is preferably made of a material having a relatively high specific heat and good thermal conductivity. Heat sink 52 is provided with an outer surface, or finish, 70, the emissivity of which is maximized. In the preferred embodiment, member 54 is fabricated from aluminum and finish 70 is a hard black anodize.

Package 12 containing precision analog component 10 which is sensitive to error voltages in the microvolt level is mounted on substrate 30 in the conventional manner with the bottom surface 26 of base 24 of package 12 substantially uniformly spaced from the upper surface 50 of substrate 30, a distance substantially equal to the height of spacer 28. This permits standard board application techniques to be used in mounting package 12 on board 30 and also permits any debris from the fabrication process to be removed before heat sink 52 is positioned on or around the outer surface 58 of can 14 of package 12. The resiliency of heat sink 52 and the existence of slit 68 makes it relatively easy to position heat sink 52 on package 12 with good thermal contact being established between the inner surface 56 of ring 52 and the outer surface 58 of can 14. Ring 52 is positioned on package 12 so that the lower inner portion of ring 54 can contact rim 66 of eyelet 18. When this is the case, skirt 64 will substantially enclose the space between the base 24 of package 12 and the upper surface 50 of substrate 30 underlying package 12 mounted thereon.

The characteristics of heat sink 52, its mass, its specific heat, and its thermal conductivity provide a large thermal mass compared to those of the sources of heat within the package. The relatively large exposed surface areas of heat sink 52 together with the emissivity of its surface finish permit heat sink 52 to transfer heat by radiation and convection from heat sink 52 to the ambient environment of the package 12. These characteristics of heat sink 52 minimize temperature gradients across the dice of device 10 once operating conditions have stabilized, which will occur relatively quickly after power is applied to component 10. Depending skirt 64 together with base 24 of package 12 and the upper surface 50 of P.C. board 30 underlying package 12 define a substantially closed chamber within which leads 20 are located. The temperature within this chamber rapidly becomes isothermal thus forming an isothermal chamber shortly after component 10 is energized. Skirt 64 also greatly reduces air currents from outside the skirt from flowing into space 72 which currents are another potential source of thermoelectric induced noise. Skirt 64 which substantially extends to the upper surface 50 of substrate 30 effectively shields base 24 of package 12 from incident radiant energy from the ambient environment thus, each shield 52 creates an environment around package 12 which minimizes error voltages, or package noises, in precision analog components packaged in hermetic containers such as that illustrated and described herein.

In the preferred embodiment, the inner diameter of heat sink 52 is 0.318 inches, the diameter of the outer surface of the ring 54 is 0.440 inches and the overall diameter of the heat sink 12 is 0.625 inches. The inner diameter of skirt 64 is 0.380 inches and its external diameter is 0.430 inches. The overall height of skirted heat sink 52 is 0.325 inches.

Skirted heat sink 52 is provided with a slit 68 to facilitate positioning it on package 12 after package 12 is mounted on substrate 30. Heat sink 52 can be formed without slit 68 in which case it is necessary that the precision with which heat sink 52 is manufactured, particularly the diameter of its internal surface, be such as to provide a slidable fit between the inner surface of the heat sink and the outer surface of the package which is the equivalent of a spring fit.

It should be evident that various modications can be made apart from those described and mentioned herein without departing from the scope and spirit the present invention.

We claim:

1. Apparatus for minimizing unpredictable noise for precision solid state electronic devices comprising:
   at least one solid state electronic device having a planar base bottom surface and a plurality of leads extending from said planar base bottom surface;
   a supporting substrate having a planar top surface located beneath said solid state electronic device, said solid state electronic device mounted on said planar surface of said supporting substrate and providing a space between said planar base bottom surface of said solid state electronic device and said top surface of said supporting substrate;
   heat diffuser means, said heat diffuser means comprises
   heat sink portion having a large thermal mass relative to that of said solid state electronic device in direct contact with a substantial portion of said solid state electronic device for maintaining a temperature within said solid state electronic device substantially constant and also for transferring heat by radiation and convection to a surrounding environment,
   a positioning means for positioning said planar base bottom surface of solid state electronic device at a pre-determined height above and substantially parallel to said planar top surface of said supporting substrate, and
   a skirt portion of said heat diffuser means, said skirt portion extending beneath said planar base bottom surface of said solid state electronic device toward said planar top surface of said supporting substrate, said skirt portion of said heat diffuser means having a thickness and a planar bottom surface, said planar bottom surface of said skirt portion of said heat diffuser means being substantially flush with said planar top surface of said supporting substrate, said thickness of said skirt portion of said heat sink substantially eliminating reflected or direct light from contacting said leads and said planar base bottom surface of said solid state electronic device to minimize noise and also to minimize temperature differentials between said leads and said planar base bottom surface of said solid state electronic device and said supporting substrate, said heat diffuser means being a single integral unit, said heat diffuser means having a single slit to facilitate insertion of said heat diffuser means onto said solid state electronic device, said slit in said heat diffuser means tranversing from said planar bottom of said heat diffuser means to the top of said heat diffuser means, said heat diffuser means being of a single piece construction.

2. Apparatus as defined in claim 1 in which said slit of said heat diffuser means is substantially vertical to said planar base bottom surface of said solid state electronic device.

3. Apparatus as defined in claim 2 in which said slit of said heat diffuser means has an orientation outward from the center of said heat diffuser means.

4. A heat sink and a solid state electronic device, said solid state electronic device mounted in a sealed package, said sealed package being mounted on the surface of a substrate, said sealed package having a base and sides with leads extending from said base and said base including glass seals around said leads and a spacer projecting given distance from said base, said heat sink comprising:
   a ring of material having a high specific heat and good thermal conductivity and having an inner surface and an outer surface, said inner surface being in good thermal contact with said sides of said sealed package,
   a skirt means having an edge made of said ring of material integrally coupled to said ring at a peripheral area of said ring and extending toward said substrate surface below of base of said sealed package, said skirt having a planar bottom surface for minimizing noise in said solid state electronic device by substantially eliminating direct or reflected light from contacting said base or said glass seals or said leads of said sealed package on which said heat sink is placed, said skirt means being of single piece construction with said ring of material and said skirt having a contiquous slit to facilitate insertion of said heat sink onto said sealed package.

5. The combination of claim 4 in which said heat sink is made of aluminum.

6. The combination of claim 4 in which said substrate comprises a printed circuit board having a substantially planar surface.

* * * * *